(12) United States Patent
Okano (10) Patent No.: US 12,170,216 B2
(45) Date of Patent: Dec. 17, 2024

(54) TRANSFER DEVICE, PROCESSING SYSTEM, AND TRANSFER METHOD

(71) Applicant: Tokyo Electron Limited, Tokyo (JP)

(72) Inventor: Shinya Okano, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 259 days.

(21) Appl. No.: 17/759,117

(22) PCT Filed: Jan. 13, 2021

(86) PCT No.: PCT/JP2021/000816
§ 371 (c)(1),
(2) Date: Jul. 20, 2022

(87) PCT Pub. No.: WO2021/149551
PCT Pub. Date: Jul. 29, 2021

(65) Prior Publication Data
US 2023/0038276 A1 Feb. 9, 2023

(30) Foreign Application Priority Data
Jan. 22, 2020 (JP) .................. 2020-008497

(51) Int. Cl.
*H01L 21/677* (2006.01)
*H01L 21/687* (2006.01)

(52) U.S. Cl.
CPC .. *H01L 21/67742* (2013.01); *H01L 21/67784* (2013.01); *H01L 21/68721* (2013.01)

(58) Field of Classification Search
CPC ......... H01L 21/67742; H01L 21/67784; H01L 21/68721; H01L 21/67253; H01L 21/67259; H01L 21/67766; H01L 21/67167; H01L 21/68707; H01L 21/67745; B25J 15/00; B25J 11/0095; B25J 15/0014
USPC ........................................... 700/245
See application file for complete search history.

(56) References Cited

U.S. PATENT DOCUMENTS

| | | | |
|---|---|---|---|
| 9,929,030 B2 * | 3/2018 | Wakabayashi | .... H01L 21/67126 |
| 2009/0081005 A1 * | 3/2009 | Miyasaka | ......... H01L 21/67766 414/217 |
| 2010/0290886 A1 * | 11/2010 | Hashimoto | .......... B25J 11/0095 414/800 |

(Continued)

FOREIGN PATENT DOCUMENTS

| | | | | |
|---|---|---|---|---|
| CN | 110036346 A | * | 7/2019 | ............... G03F 7/20 |
| JP | H106-345262 | | 12/1994 | |

(Continued)

OTHER PUBLICATIONS

JP2014099542A.translate, Substrate Delivery Mechanism, Substrate Carrying Device andSubstrate Delivery Method; Norihisa et al. (Year: 2012).*

(Continued)

*Primary Examiner* — B M M Hannan
(74) *Attorney, Agent, or Firm* — IPUSA, PLLC (57) ABSTRACT

According to one aspect of the present disclosure, a transfer device has a first holding part configured to contact an edge part of a substrate when holding the substrate, and a second holding part formed with an elastic member and configured to contact only a back surface of the substrate when holding the substrate.

12 Claims, 7 Drawing Sheets

(56) References Cited

U.S. PATENT DOCUMENTS

| | | | |
|---|---|---|---|
| 2015/0098790 A1* | 4/2015 | Wakabayashi | B25J 11/0095 |
| | | | 414/800 |
| 2016/0319456 A1* | 11/2016 | Yoshioka | H01L 24/11 |
| 2018/0104827 A1* | 4/2018 | Goto | H01L 21/68707 |
| 2018/0224754 A1* | 8/2018 | Babayan | H01L 21/67167 |
| 2019/0067077 A1* | 2/2019 | Muramoto | H01L 21/67046 |
| 2019/0096729 A1* | 3/2019 | Muramoto | H01L 21/68707 |
| 2019/0203373 A1* | 7/2019 | Fujikata | H01L 21/68707 |
| 2019/0206710 A1* | 7/2019 | Lei | H01L 21/67742 |
| 2019/0252229 A1* | 8/2019 | Ishii | H01L 21/67778 |
| 2022/0283505 A1* | 9/2022 | Schreuder | G03F 7/707 |

FOREIGN PATENT DOCUMENTS

| | | | | |
|---|---|---|---|---|
| JP | 2008-244318 | | 10/2008 | |
| JP | 2012-074498 | | 4/2012 | |
| JP | 2012074498 A | * | 4/2012 | |
| JP | 2014-099542 | | 5/2014 | |
| JP | 2018090848 A | * | 6/2018 | C25D 17/001 |
| KR | 20130010825 A | * | 1/2013 | |
| WO | 2016/166952 | | 10/2016 | |

OTHER PUBLICATIONS

JP2012074498A.translate; Substrate Processing Apparatus and Substrate Transfer Methodand Storage Medium Storing Program for Executing That Method; Okano Shinya. (Year: 2012).*

JP2008153577A.translate; Method and Device for Conveying Sheet Substrate; Matsumoto Yasuaki. (Year: 2008).*

* cited by examiner

| PRE-PROCESSING TRANSFER MODE | HOLDING-POSITION INFORMATION | TRANSFER-SPEED INFORMATION |
|---|---|---|
| A | ○ | ○ |
| B | ○ | × |
| C | × | ○ |
| D | × | × |

TRANSFER DEVICE, PROCESSING SYSTEM, AND TRANSFER METHOD

TECHNICAL FIELD

The present disclosure relates to a transfer device, a processing system, and a transfer method.

BACKGROUND ART

A pick with an edge-gripping function for holding an edge part of a wafer is known (see, for example, Patent Document 1).

RELATED-ART DOCUMENTS

Patent Documents

Patent Document 1: Japanese Unexamined Patent Application Publication No. 2012-74498

SUMMARY OF THE INVENTION

Problem to be Solved by the Invention

The present disclosure provides a technique whereby the holding position of a substrate can be changed according to the type of the substrate.

Means to Solve the Problem

According to one aspect of the present disclosure, a transfer device has a first holding part configured to contact an edge part of a substrate when holding the substrate, and a second holding part formed with an elastic member and configured to contact only a back surface of the substrate when holding the substrate.

Effects of the Invention

According to the present disclosure, the holding position of a substrate can be changed according to the type of the substrate.

MODE FOR CARRYING OUT THE INVENTION

Now, a non-limiting example of an embodiment of the present disclosure will be described below with reference to the accompanying drawings. In all of the accompanying drawings, members or parts that are the same or similar will be assigned the same or similar reference numerals, and overlapping description will not be repeated.

[Processing System]

Figure 1:
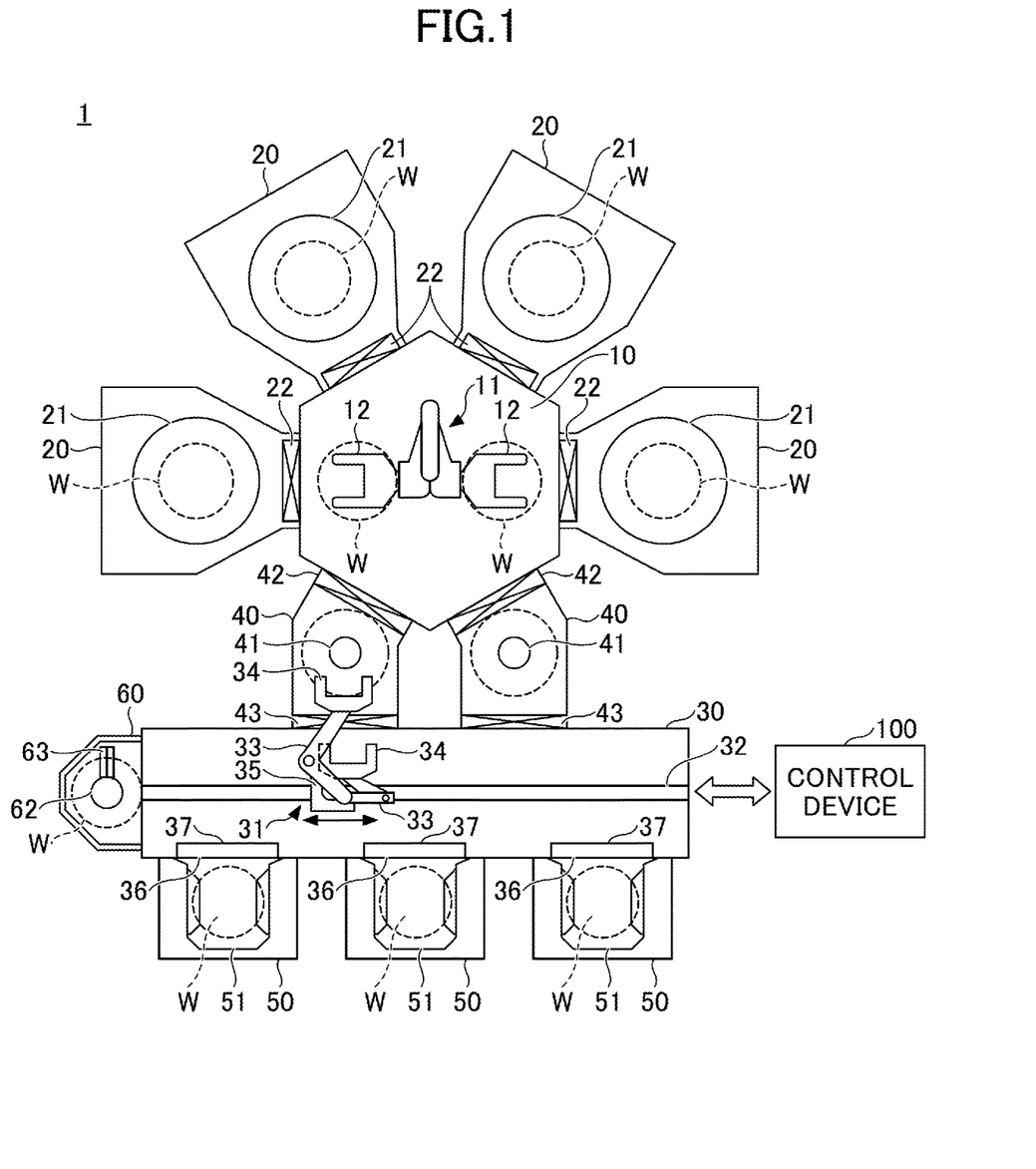
FIG. 1 is a diagram illustrating an example of a processing system according to an embodiment.

A processing system according to an embodiment will be described below with reference to FIG. 1. FIG. 1 is a diagram illustrating an example of a processing system according to the embodiment.

A processing system 1 includes a transfer module 10, four processing modules 20, a loader module 30, two load-lock modules 40, and a control device 100.

The transfer module 10 has a substantially hexagonal shape in plan view. The transfer module 10 is composed of a vacuum chamber, and a transfer device 11 is placed inside. The transfer device 11 is formed with multi-joint arms that are capable of bending, stretching, moving up and down, and spinning, at a position where the processing module 20 and the load-lock module 40 are accessible. The transfer device 11 has two picks 12. The picks 12 can bend and stretch individually in mutually opposite directions, and can transfer two wafers W at a time. Note that the transfer device 11 is not limited to the configuration illustrated in FIG. 1 as long as it can transfer wafers W between the processing module 20 and the load-lock module 40.

The processing modules 20 are arranged radially around the transfer module 10, and connected to the transfer module 10. Each processing module 20 consists of a chamber, and inside is a columnar stage 21 for placing a wafer W. In the processing module 20, a predetermined process such as a film forming process is applied to the wafer W placed on the stage 21. The transfer module 10 and the processing modules 20 are separated by gate valves 22 that can be opened and closed.

The loader module 30 is arranged to face the transfer module 10. The loader module 30 has a rectangular shape, and is an air transfer chamber maintained under an air atmosphere. A transfer device 31 is arranged inside the loader module 30. A guide rail 32 that extends longitudinally through a central portion of the loader module 30 is provided, and the transfer device 31 is slidably supported on this guide rail 32. The guide rail 32 contains, for example, a linear motor having an encoder, and, by driving this linear motor, the transfer device 31 moves along the guide rail 32.

The transfer device 31 has, as transfer arms, two multi-joint arms 33 that are placed at two levels, upper and lower. A pick 34 formed in a bifurcated shape is attached to the tip of each multi-joint arm 33. A wafer W is held on each pick 34. Each multi-joint arm 33 is capable of bending, stretching, and moving up and down radially from the center. Furthermore, the bending and stretching movement of each multi-joint arm 33 can be controlled individually. The rotation axis of each multi-joint arm 33 is connected to a base 35 so that the multi-joint arms 33 can rotate coaxially and, for example, rotate together as one in a spinning direction relative to the base 35. The guide rail 32 and the multi-joint arms 33 function as a drive mechanism for moving the picks 34. The transfer device 31 transfers wafers W among the load-lock modules 40, the transfer casing 51, and the aligner 60, which will be described later. Note that the transfer device 31 is not limited to the configuration illustrated in FIG. 1 as long as it can transfer wafers W among the load-lock modules 40, the transfer casing 51, and the aligner 60.

Two load-lock modules 40 are connected to one lengthwise side surface of the loader module 30. Meanwhile, one or a plurality of inlets 36 for introducing wafers W are provided on the other lengthwise side surface of the loader module 30. In the illustrated example, three inlets 36 are provided. Each inlet 36 is provided with an open/close door 37 that can be opened/closed. Furthermore, load ports 50 are provided in association with each inlet 36. A transfer casing 51 for accommodating and transferring wafers W is placed on each load port 50. The transfer casing 51 may be a FOUP (Front-Opening Unified Pod), in which a plurality of (for example, 25) wafers W are placed and accommodated on multiple levels at predetermined intervals.

An aligner 60 is connected to one widthwise side surface of the loader module 30. The aligner 60 adjusts the position of wafers W. The aligner 60 has a rotating stage 62 that is rotated by a drive motor (not shown). The aligner 60 rotates with a wafer W placed on the rotating stage 62. The rotating stage 62 has a diameter that is smaller than the diameter of the wafer W. An optical sensor 63 for detecting the outer rim part of the wafer W is provided in the outer periphery of the rotating stage 62. The aligner 60 detects the center position of the wafer W and the direction of the notch with respect to the center of the wafer W, by using the optical sensor 63. The aligner 60 adjusts the position for transferring the wafer W such that the center position of the wafer W assumes a predetermined position and the direction of the notch assumes a predetermined direction in the load-lock modules 40.

The load-lock modules 40 are arranged between the transfer module 10 and the loader module 30. Each load-lock module 40 consists of an internal pressure-changeable chamber. The inside of the interval pressure-changeable chambers can be switched between vacuum and atmospheric pressure. A columnar stage 41 for placing the wafer W is provided inside each load-lock module 40. The stage 41 has a diameter smaller than the diameter of the wafer W. When loading a wafer W from the loader module 30 onto the transfer module 10, the load-lock module 40 maintains the inside at atmospheric pressure and receives the wafer W from the loader module 30, and afterwards decompresses the inside and loads the wafer W onto the transfer module 10. Furthermore, when unloading a wafer W is from the transfer module 10 onto the loader module 30, the load-lock module 40 maintains the inside in a vacuum and receives the wafer W from the transfer module 10, and afterwards increases the internal pressure up to atmospheric pressure and unloads the wafer W onto the loader module 30. The load-lock modules 40 and the transfer module 10 are separated by gate valves 42 that can be opened and closed. Furthermore, the load-lock modules 40 and the loader module 30 are separated by gate valves 43 that can be opened and closed.

Figure 2:
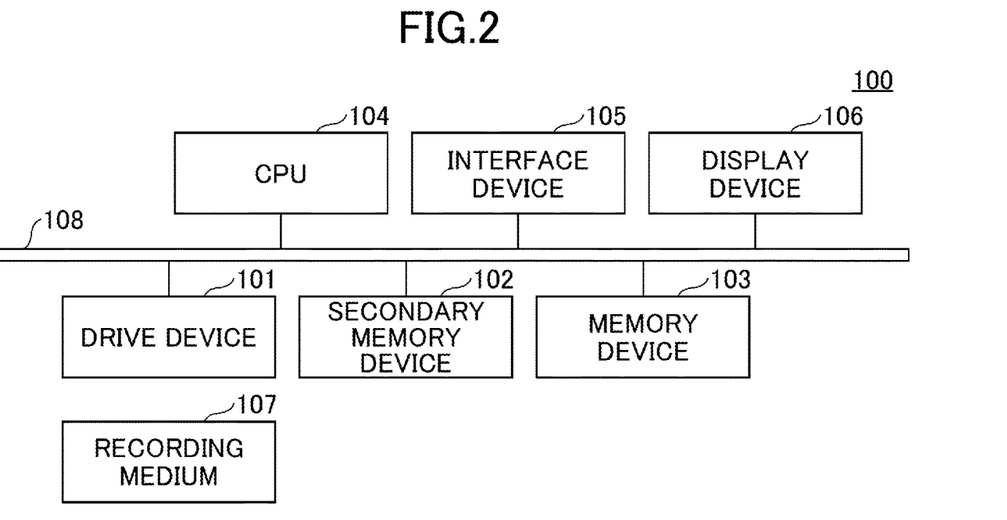
FIG. 2 is a diagram illustrating an example of a hardware configuration of a control device.

The control device 100 controls the operation of each component of the processing system 1. As illustrated in FIG. 2, the control device 100 is a computer that has a drive device 101, a secondary memory device 102, a memory device 103, a CPU 104, an interface device 105, a display device 106, and the like, which are connected with each other via a bus 108. The programs to implement the processing in the control device 100 are provided by a recording medium 107, which is, for example, a CD-ROM. For example, when the recording medium 107 that stores a program is set in the drive device 101, the program is installed from the recording medium 107 to the secondary memory device 102 via the drive device 101. However, programs do not always have to be installed from the recording medium 107, and, for example, may be downloaded from another computer via a network. The secondary memory device 102 stores necessary information such as installed programs and recipes. When there is a command to start a program, the memory device 103 reads and stores the program from the secondary memory device 102. The CPU 104 executes the functions related to the processing system 1 in accordance with the program stored in the memory device 103. The interface device 105 is used as an interface for connecting with a network. The display device 106 displays various information, and also functions as an operation unit through which the operator inputs operations.

[Transfer Device]

Figure 3:
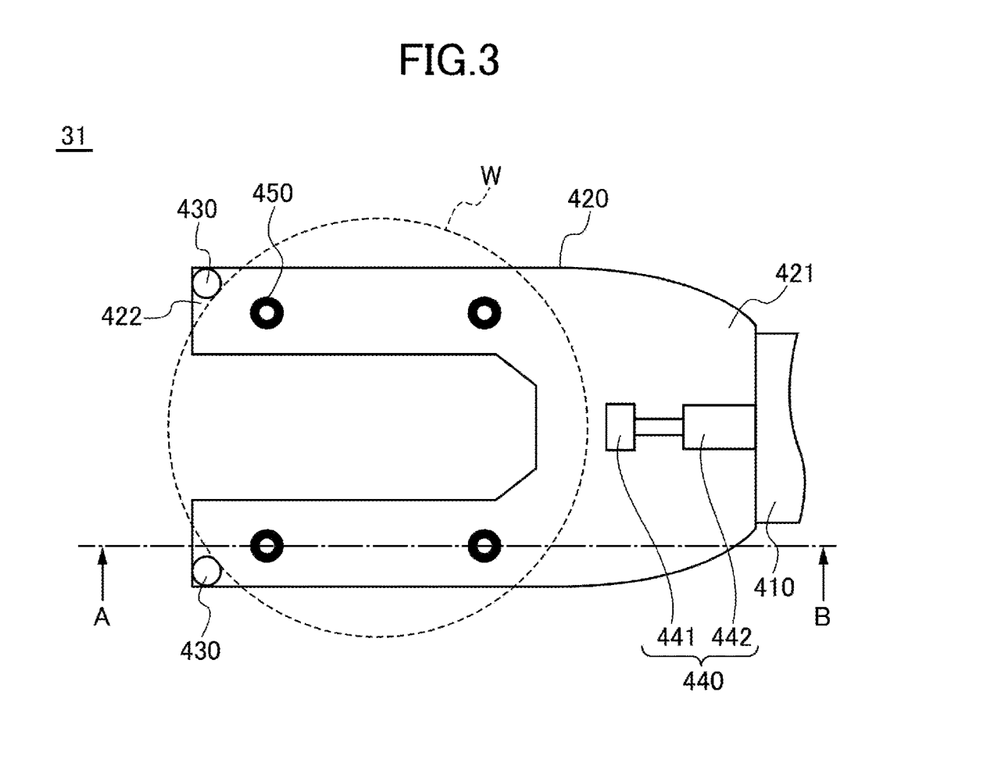
FIG. 3 is a top view illustrating an example of a transfer device.
Figure 4:
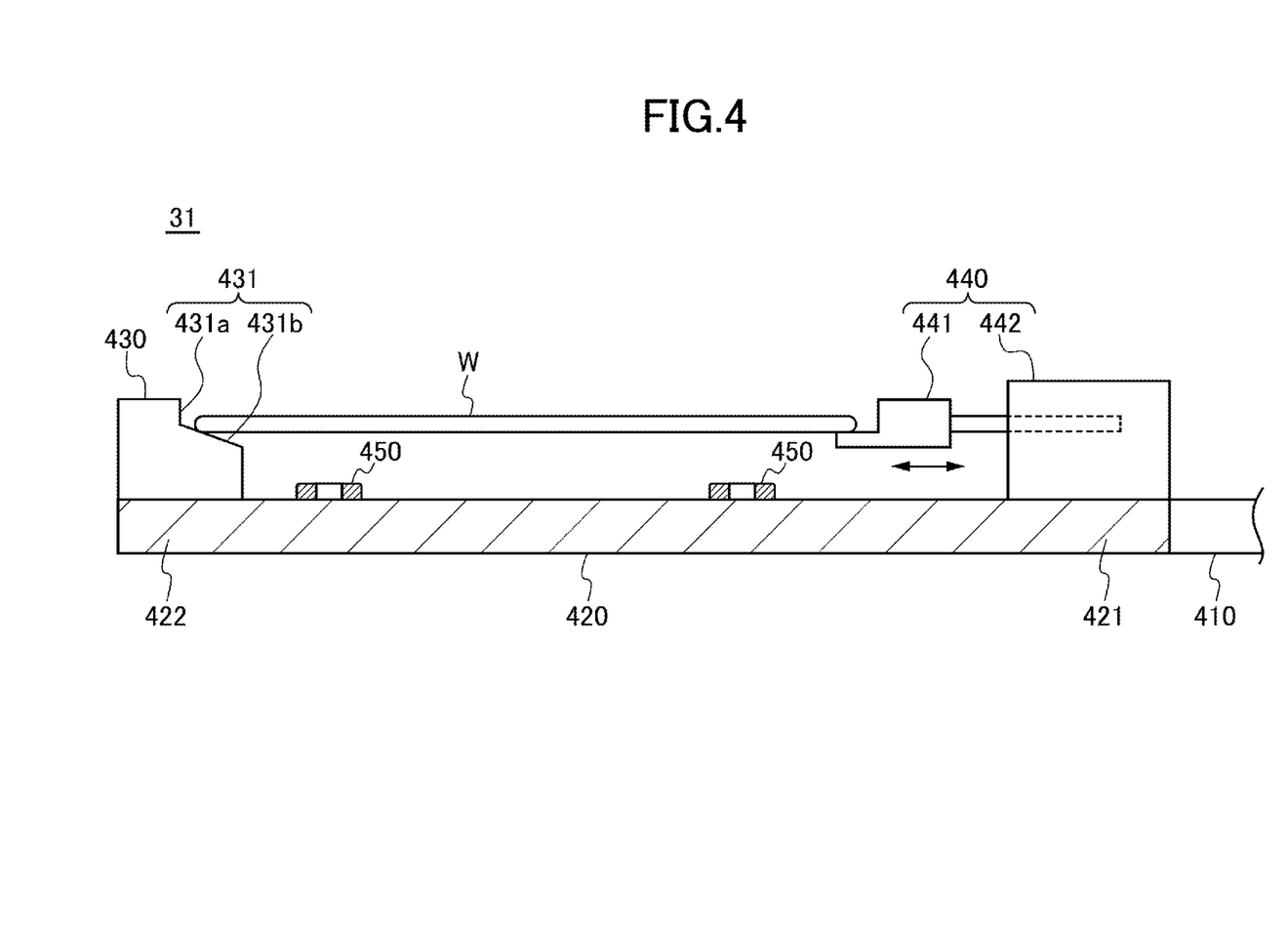
FIG. 4 is a cross-sectional view (1) illustrating an example of the transfer device.
Figure 5:
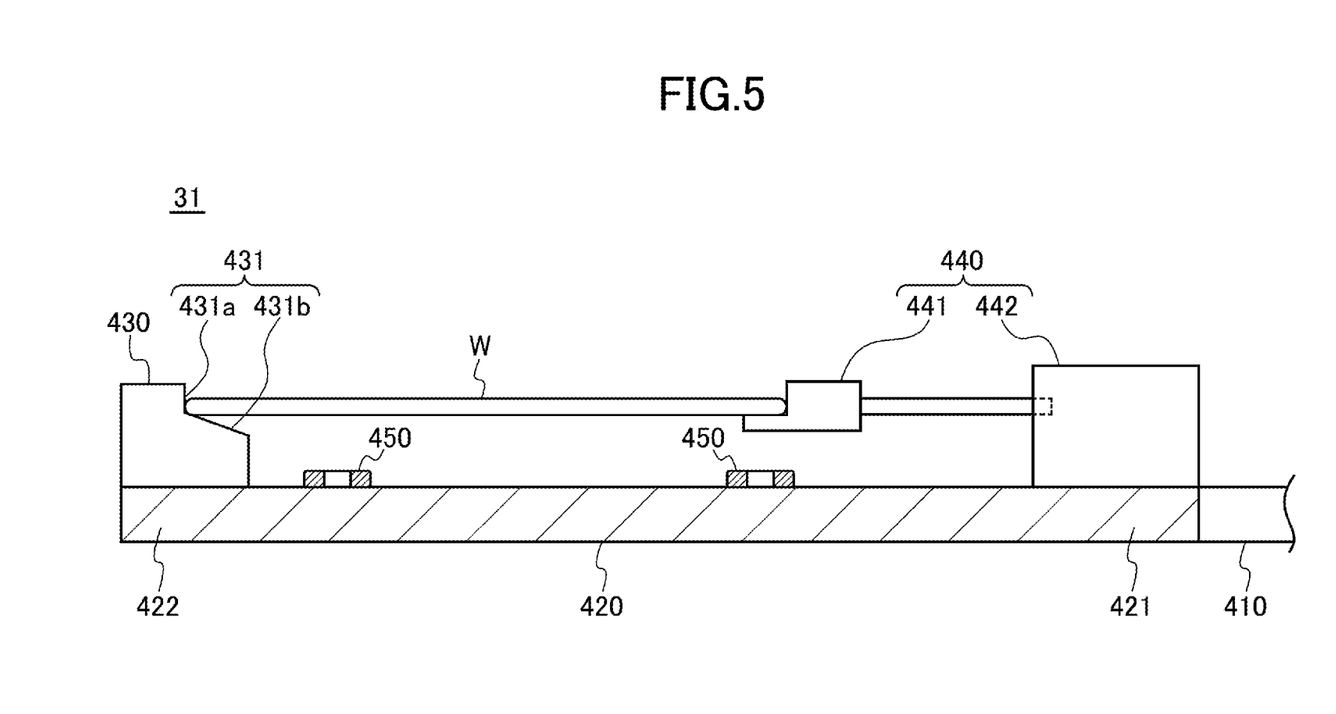
FIG. 5 is a cross-sectional view (2) illustrating an example of the transfer device.
Figure 6:
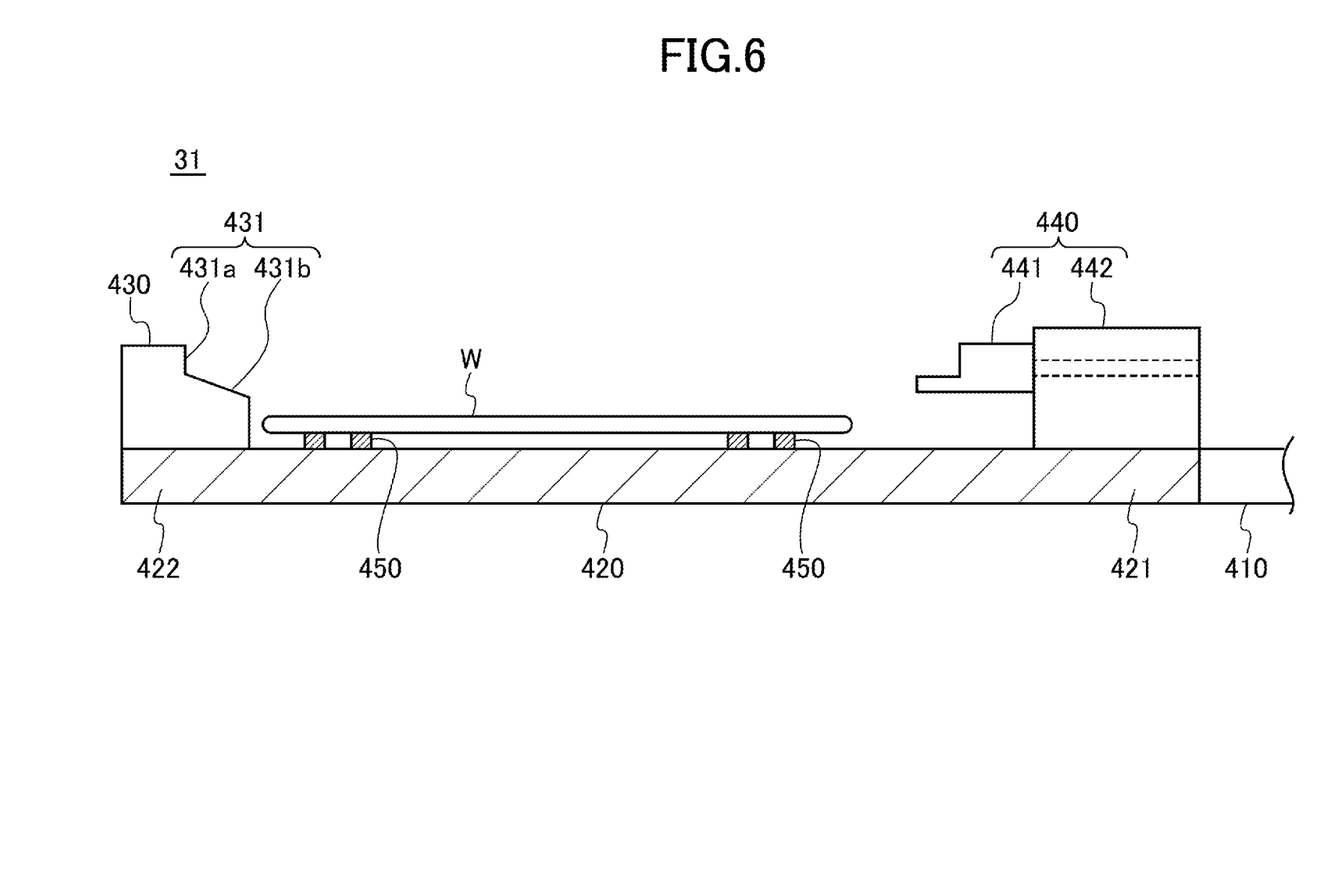
FIG. 6 is a cross-sectional view (3) illustrating an example of the transfer device.

An example of the transfer device 31 in the above-described processing system 1 will be described with reference to FIG. 3 to FIG. 6. Note that the transfer device 11 may have the same configuration as the transfer device 31. FIG. 3 is a top view illustrating an example of the transfer device 31. FIG. 4 to FIG. 6 are cross-sectional views illustrating examples of the transfer device 31, and show cross sections cut along center line A-B in FIG. 3.

Referring to the above drawings, the transfer device 31 at least has a multi-joint arm 410, a pick 420, a blocking body 430, a pressing holding part 440, and an elastic body 450. The multi-joint arm 410 and the pick 420 correspond to the multi-joint arm 33 and the pick 34 of FIG. 1, respectively.

The pick 420 is formed flat and substantially U-shaped in plan view. The pick 420 has its base edge part 421 connected to the tip of the multi-joint arm 410.

The blocking body 430 is provided in the tip part 422 of the pick 420. The blocking body 430 is provided, for example, at a position where the blocking body 430 does not contact the wafer W (see FIG. 6) held by the elastic body 450. Each blocking body 430 has a blocking wall 431 that prevents the wafer W on the pick 420 from moving horizontally. The blocking wall 431 is provided at a position higher than the position where the elastic body 450 holds the wafer W, and holds the wafer W in that position. The blocking wall 431 includes, for example, a vertical part 431$a$ and a tapered part 431$b$. The tapered part is slanted below the vertical part 431$a$. However, the blocking wall 431 may include a vertical part 431$a$ and a horizontal part that extends horizontally below the vertical part 431$a$. Since the blocking body 430 contacts the edge part of the wafer W, the blocking body is preferably made of a material that does not damage the wafer W, such as a resin.

The pressing holding part 440 is provided at a position separate from the blocking body 430. For example, the pressing holding body 440 is provided in the base edge part 421 of the pick 420, where the pressing holding part 440 does not contact the wafer W (see FIG. 6) held by the elastic body 450. However, the pressing holding part 440 may be provided in the multi-joint arm 410. The pressing holding part 440 includes a pressing body 441 and a drive part 442.

The pressing body 441 is free to contact the edge part of the wafer W, and abuts and presses against the edge part of the wafer W. The pressing body 441 is provided at a position higher than the position where the elastic body 450 holds the wafer W, and holds the wafer W in that position. Since the pressing body 441 contacts the edge part of the wafer W, the pressing body 441 is preferably made of a material that does not damage the wafer W, such as a resin.

The drive part 442 moves the pressing body 441 to a plurality of positions by driving the pressing body 441. These positions include the receiving position, the holding position, and the retracted position. As illustrated in FIG. 4, the receiving position is the position where the blocking body 430 and the pressing body 441 receive the wafer W, and is a position between the holding position and the retracted position. The holding position is the position where the pressing body 441 is extended as illustrated in FIG. 5, and is the position where the blocking body 430 and the pressing body 441 hold the wafer W therebetween by pressing the edge part of the wafer W against the blocking wall 431 of the blocking body 430. The retracted position is the position where the pressing body 441 is contracted, as illustrated in FIG. 6, and is a position where pressing body 441 does not contact the wafer W when the elastic body 450 holds only the back surface of the wafer W. The drive part 442 is composed of, for example, a robo-cylinder. However, the drive part 442 may be composed of, for example, a linear motor, a stepping motor, a DC motor, an air cylinder, and so forth.

The elastic body 450 is provided at a position, on the upper surface of the pick 420, that is not in contact with the wafer W held by the blocking body 430 and the pressing body 441. The elastic body 450 holds the wafer W by contacting only the back surface of the wafer W without contacting the side surface of the wafer W. Furthermore, the horizontal position and vertical position of the wafer W when held by the elastic body 450 (see FIG. 6) are different from the horizontal position and vertical position of the wafer W when held by the blocking body 430 and the pressing body 441 (see FIG. 5). A plurality of (for example, four) elastic bodies 450 are provided, for example, in the tip parts 422 of the pick 420. The elastic bodies 450 are formed by elastic members such as O-rings.

After the pressing body 441 is moved to the receiving position as illustrated in FIG. 4 and the blocking body 430 and the pressing body 441 receive the wafer W, the transfer device 31 moves the pressing body 441 to the holding position as illustrated in FIG. 5. As a result of this, the edge part of the wafer W is pressed against the blocking wall 431 of the blocking body 430, and the wafer W is held between the blocking body 430 and the pressing body 441. In other words, the blocking body 430 and the pressing body 441 function as a first holding part that holds the wafer W by contacting the edge part of the wafer W.

Furthermore, as illustrated in FIG. 6, after the pressing body 441 is moved to the shelter position, the wafer W is received by the elastic body 450, and thus the wafer W is held in a state in which only the back surface of the wafer W is in contact with the elastic body 450. In other words, the elastic body 450 functions as a second holding part that holds the wafer W by contacting only the back surface of the wafer W.

As described above, the embodiment transfer device 31 has a first holding part (blocking body 430 and pressing body 441) that holds the wafer W by contacting the edge part of the wafer W, and a second holding part (elastic body 450) that holds the wafer W by contacting only the back surface of the wafer W. By this means, the holding position of the wafer W can be changed according to the type of the wafer W.

[Transfer Method]

Figure 7:
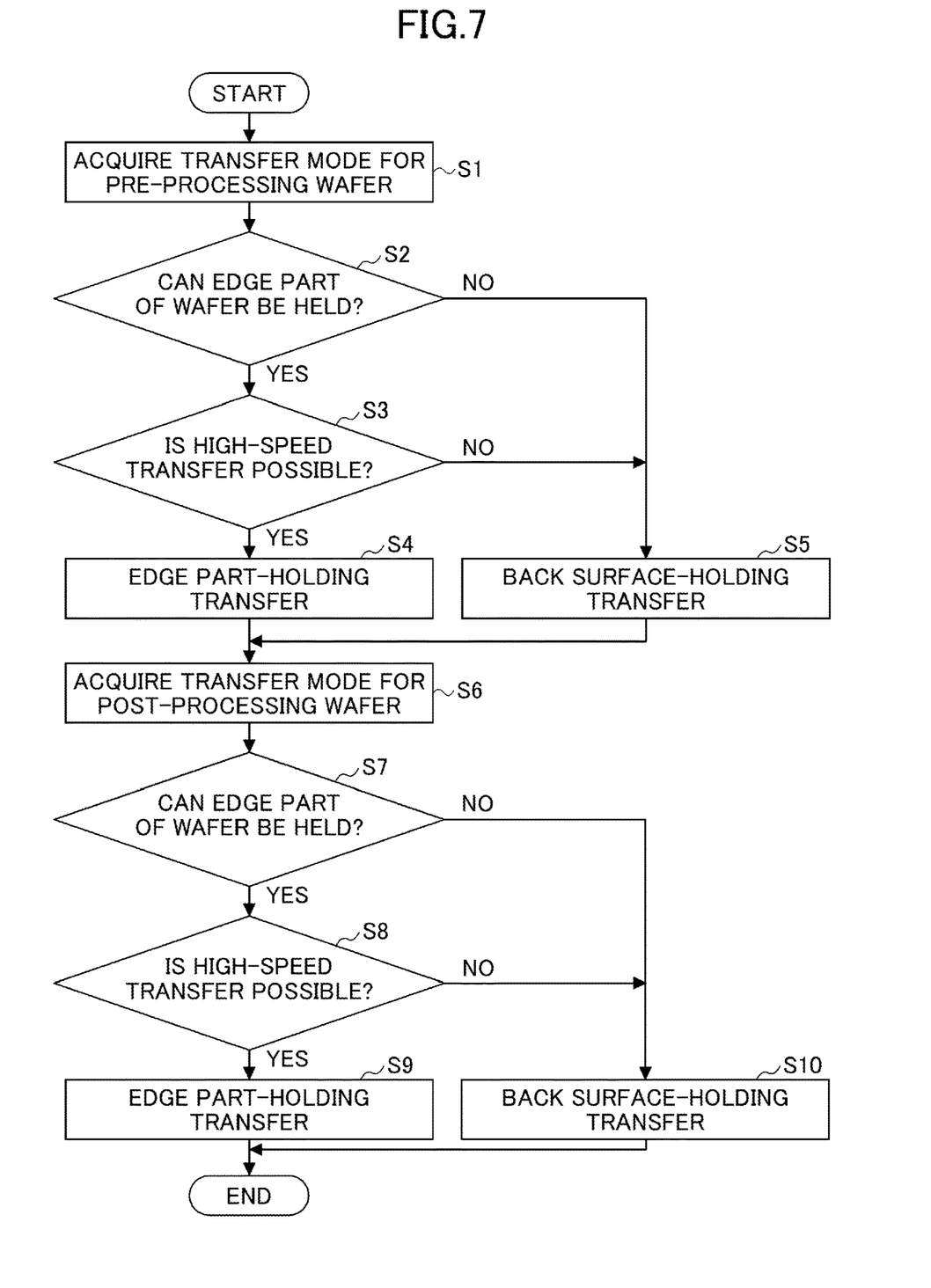
FIG. 7 is a flowchart illustrating an example of a transfer method according to an embodiment.

Now, an example operation (hereinafter referred to as "transfer method") in which the transfer device 31 transfers the wafer W in the above-described processing system 1 will be described with reference to FIG. 7. FIG. 7 is a flowchart illustrating an example of the transfer method according to the embodiment. The following transfer method is executed by the control device 100, for example, when the transfer casing 51 is placed on the load port 50.

In step S1, the control device 100 acquires the transfer mode (hereinafter referred to as "pre-processing transfer mode") for the wafer W before being processed in the processing module 20 (hereinafter referred to as "pre-processing wafer"). For example, the control device 100 acquires a pre-processing transfer mode associated with the type of the pre-processing wafer accommodated in the transfer casing 51 placed on the load port 50. Examples of the types of pre-processing wafers include a dummy wafer, a product wafer, and a laminated wafer. The pre-processing transfer mode includes information as to whether the wafer W can be held by the edge part (hereinafter referred to as "holding position information"), and information as to whether the wafer W can be transferred at high speed (hereinafter referred to as "transfer speed information"). The correspondence between pre-processing wafers and pre-processing transfer modes are stored in, for example, the secondary memory device 102.

Figure 8:
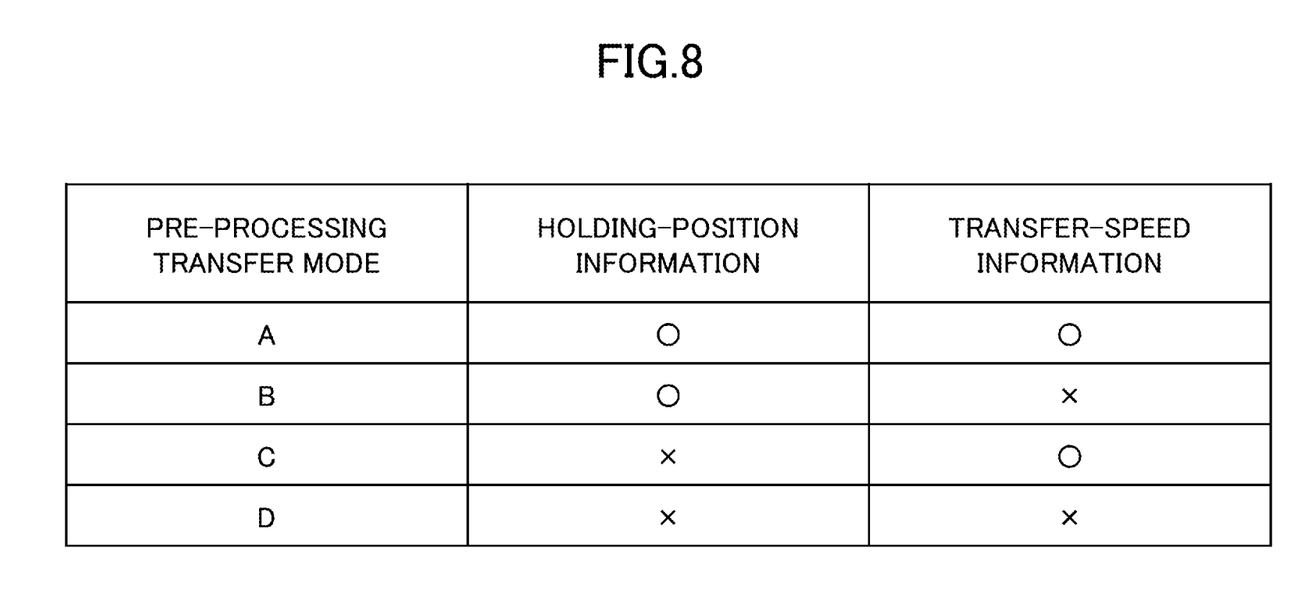
FIG. 8 is a diagram illustrating examples of pre-processing transfer modes.

FIG. 8 is a diagram illustrating examples of pre-processing transfer modes. As illustrated in FIG. 8, pre-processing transfer modes include, for example, four transfer modes A to D. Transfer mode A includes information indicating that the wafer W can be held by the edge part, as holding position information, and information indicating that high-speed transfer is possible, as transfer speed information. Transfer mode B includes information indicating that the wafer W can be held by the edge part, as holding position information, and information indicating that high-speed transfer is not possible, as transfer speed information. Transfer mode C includes information indicating that the wafer W cannot be held by the edge part, as holding position information, and information indicating that high-speed transfer is possible, as transfer speed information. Transfer mode D includes information indicating that the wafer W cannot be held by the edge part, as holding position information, and information indicating that high-speed transfer is not possible, as transfer speed information.

Furthermore, for example, when the transfer casing 51 is placed on the load port 50, the control device 100 may display a screen for allowing the operator to select the pre-processing transfer mode on the display device 106. In this case, the control device 100 operates the display device 106 to acquire the pre-processing transfer mode selected by the operator. In this way, the pre-processing transfer mode may be selected automatically or manually.

In step S2, the control device 100 determines whether or not the pre-processing wafer accommodated in the transfer casing 51 can be held by the edge part, based on the holding position information included in the pre-processing transfer mode acquired in step S1. If the control device 100 determines in step S2 that the pre-processing wafer can be held by the edge part, the control device 100 moves the process to step S3. On the other hand, if the control device 100 determines in step S2 that the pre-processing wafer cannot be held by the edge part, the control device 100 moves the process to step S5.

In step S3, the control device 100 determines whether or not the pre-processing wafer accommodated in the transfer casing 51 can be transferred at high speed, based on the transfer speed information included in the pre-processing transfer mode acquired in step S1. If it is determined in step S3 that the pre-processing wafer can be transferred at high speed, the control device 100 moves the process to step S4. On the other hand, if it is determined in step S3 that the pre-processing wafer cannot be transferred at high speed, the control device 100 moves the process to step S5.

In step S4, the control device 100 sets the operation of the transfer device 31 for the pre-processing wafer W such that the transfer device 31 performs the operation of bringing the blocking body 430 and the pressing body 441 into contact with the edge part of the wafer W and holding the wafer W (hereinafter referred to as the "edge part-holding transfer").

The operation of the transfer device 31 includes, for example, information related to a teaching position.

In step S5, the control device 100 sets the operation of the transfer device 31 for the pre-processing wafer W such that the transfer device 31 performs the operation of bringing the elastic body 450 into contact with only the back surface of the wafer W and holding the wafer W (hereinafter referred to as "back surface-holding transfer"). The operation of the transfer device 31 includes, for example, information related to a teaching position.

In step S6, the control device 100 acquires the transfer mode (hereinafter referred to as the "post-processing transfer mode") for the wafer W after being processed in the processing module 20 (hereinafter referred to as the "post-processing wafer"). The post-processing transfer mode, like the pre-processing transfer mode, includes holding position information and transfer speed information. The post-processing transfer mode may be selected automatically or manually, in the same manner as the selection of the pre-processing transfer mode. For example, the control device 100 acquires a post-processing transfer mode associated with the type of the unprocessed wafer accommodated in the transfer casing 51 mounted on the load port 50.

In step S7, the control device 100 determines whether or not the pre-processing wafer accommodated in the transfer casing 51 can be held by the edge part after being processed in the processing module 20, based on the holding position information included in the post-processing transfer mode acquired in step S6. If it is determined in step S7 that the post-processing wafer can be held by the edge part, the control device 100 moves the process to step S8. On the other hand, if it is determined in step S7 that the post-processing wafer cannot be held by the edge part, the control device 100 moves the process to step S10.

In step S8, the control device 100 determines, based on the transfer speed information included in the post-processing transfer mode acquired in step S6, whether or not the pre-processing wafer accommodated in the transfer casing 51 can be transferred at high speed after being processed in the processing module 20. If it is determined in step S8 that the post-processing wafer can be transferred at high speed, the control device 100 moves the process to step S9. On the other hand, if it is determined in step S8 that the post-processing wafer cannot be transferred at high speed, the control device 100 moves the process to step S10.

In step S9, the control device 100 sets the operation of the transfer device 31 for the post-processing wafer so as to execute edge part-holding transfer, and finishes the process. The operation of the transfer device 31 includes, for example, information related to a teaching position.

In step S10, the control device 100 sets the operation of the transfer device 31 for the post-processing wafer so as to execute back surface-holding transfer, and finishes the process. The operation of the transfer device 31 includes, for example, information related to a teaching position.

By means of the above transfer method, edge part-holding transfer or back surface-holding transfer of the wafer W can be carried out according to the type of the wafer W by using one transfer device 31.

For example, when holding a dummy wafer, the control device 100 controls the transfer device 31 to hold the wafer W by bringing the first holding part into contact with the edge part of the wafer W. When holding a product wafer, the control device 100 controls the transfer device 31 to hold the wafer W by bringing the second holding part into contact only with the back surface of the wafer W. As a result of this, the operation of transferring a dummy wafer at high speed by holding the edge part of the wafer W and the operation of transferring a product wafer while keeping the edge part of the wafer W clean are carried out by using one transfer device 31.

Furthermore, for example, the control device 100 controls the transfer device 31 such that, when a pre-processing wafer is held, the wafer W is held by either the first holding part or the second holding part, and, when the post-processing wafer is held, the wafer W is held by the other holding part. This can prevent cross-contamination.

Furthermore, for example, the control device 100 controls the transfer device 31 such that, when holding a wafer that is formed by laminating a plurality of wafers (hereinafter referred to as "laminated wafer"), the second holding part holds the wafer W by contacting only the back surface of the wafer W. When wafers are laminated thus, the wafer on one side might be thinly polished after the wafers are laminated. In this case, if a strong impact is applied to the edge part of a wafer, the wafer may be removed or particles may be generated from that edge part. However, the transfer method of the embodiment can transfer the laminated wafer by maintaining the laminated wafer in a state in which the second holding part contacts only the back surface of the wafer W. As a result of this, no strong impact is applied to the edge part of the wafer W, so that it is possible to prevent the laminated wafer from being removed or generating particles.

Although an example case has been described with the above transfer method where the transfer operation for a pre-processing wafer is set and afterwards the transfer operation for a post-processing wafer is set, the present disclosure is not limited to this. For example, it is equally possible to set the transfer operation for a post-processing wafer and afterwards set the transfer operation for a pre-processing wafer. Furthermore, for example, the transfer operation for a pre-processing wafer and the transfer operation for a post-processing wafer may be set at the same time.

The embodiment disclosed herein should be considered to be exemplary and not restrictive in all respects. The above embodiment may be omitted, replaced or modified in a variety of ways without departing from the scope and object of the claims attached herewith.

Note that, although a case has been described with the above embodiment where the processing system is a single-wafer type that processes one wafer at a time, the present disclosure is not limited to this. For example, the processing system may be a batch type in which multiple wafers are processed at a time. Furthermore, for example, the processing system may be a semi-batch type, in which a plurality of wafers are arranged on a rotary table in a processing container, revolved by using the rotary table, and passed through a region where a first gas is supplied and a region where a second gas is supplied, in order, and thus processed.

Furthermore, although a case has been described with the above embodiment where the target to be transferred by the transfer device 31 is wafers W, the present disclosure is not limited to this. For example, the target to be transferred by the transfer device 31 may be a large substrate for a flat panel display (FPD), a substrate for an organic EL panel, or a substrate for a solar cell.

This international application is based on and claims priority to Japanese Patent Application No. 2020-008497, filed Jan. 22, 2020, the entire contents of which are incorporated herein by reference.

DESCRIPTION OF THE REFERENCE NUMERALS 1 processing system
20 processing module 31 transfer device
100 control device
410 multi-joint arm
420 pick
430 blocking body
431 blocking wall
440 pressing holding part
441 pressing body
442 drive part
450 elastic body
W wafer

The invention claimed is:

1. A transfer device comprising:
a first holding part configured to contact an edge part of a substrate when holding the substrate;
a second holding part formed with an elastic member and configured to contact only a back surface of the substrate when holding the substrate; and
a control device,
wherein the control device is configured to control the transfer device such that a transfer speed when the substrate is held by the first holding part is greater than a transfer speed when the substrate is held by the second holding part, and
wherein the first holding part is provided at a position where the first holding part does not contact the substrate being held by the second holding part, and the second holding part is provided at a position where the second holding part does not contact the substrate being held by the first holding part.

2. The transfer device according to claim 1, wherein the first holding part is configured to hold the substrate at a position higher than a position where the second holding part is configured to hold the substrate.

3. The transfer device according to claim 1, wherein the first holding part includes:
a blocking body configured to prevent the substrate from moving horizontally, and
a pressing body spaced apart from the blocking body and configured to move in such a way that the pressing body freely contacts the edge part of the substrate.

4. The transfer device according to claim 1, wherein a horizontal position of the substrate being held by the first holding part and a horizontal position of the substrate being held by the second holding part are different.

5. The transfer device according to claim 1, wherein a vertical position of the substrate being held by the first holding part and a vertical position of the substrate being held by the second holding part are different.

6. The transfer device according to claim 1, further comprising a pick connected to a transfer arm for transferring the substrate,
wherein the second holding part includes a plurality of O-rings provided on an upper surface of the pick.

7. The transfer device according to claim 6, wherein the first holding part is provided in the pick.

8. The transfer device according to claim 6, wherein the first holding part is provided in the transfer arm and in the pick.

9. The transfer device according to claim 1, further comprising a control device,
wherein the control device is configured to control the transfer device to hold the substrate by using the first holding part or by using the second holding part, according to a type of the substrate.

10. The transfer device according to claim 1, wherein the transfer device is placed in an air transfer chamber.

11. A processing system comprising:
a processing chamber configured to accommodate a substrate inside and process the substrate;
a transfer device configured to transfer the substrate accommodated in the chamber; and
a control device,
wherein the transfer device includes
a first holding part configured to contact an edge part of the substrate when holding the substrate, and
a second holding part formed with an elastic member and configured to contact only a back surface of the substrate when holding the substrate,
wherein the control device is configured to control the transfer device such that a transfer speed when the substrate is held by the first holding part is greater than a transfer speed when the substrate is held by the second holding part, and
wherein the first holding part is provided at a position where the first holding part does not contact the substrate being held by the second holding part, and the second holding part is provided at a position where the second holding part does not contact the substrate being held by the first holding part.

12. A transfer method comprising:
acquiring a transfer mode including
information as to whether or not a substrate can be held by an edge part, and
information as to whether or not the substrate can be transferred at high speed;
determining, based on the transfer mode acquired, whether to hold the substrate by contacting an edge part of the substrate or hold the substrate by contacting only a back surface of the substrate;
bringing a first holding part into contact with the edge part of the substrate to hold the substrate in response to determining to hold the substrate by contacting the edge part of the substrate; and
bringing a second holding part into contact only with the back surface of the substrate to hold the substrate in response to determining to hold the substrate by contacting only the back surface of the substrate, the second holding part being different from the first holding part,
wherein the first holding part and the second holding part are controlled such that a transfer speed when the substrate is held by the first holding part is greater than a transfer speed when the substrate is held by the second holding part.

* * * * *